US 011791376B2

(12) United States Patent
Hakamo et al.

(10) Patent No.: US 11,791,376 B2
(45) Date of Patent: Oct. 17, 2023

(54) CAPACITOR STRUCTURE (71) Applicant: COREHW SEMICONDUCTOR OY, Tampere (FI)

(72) Inventors: Markus Hakamo, Lempäälä (FI); Tomi-Pekka Takalo, Pirkkala (FI); Petri Kotilainen, Tampere (FI); Petri Heliö, Tampere (FI); Tapio Kuiri, Oulu (FI)

(73) Assignee: COREHW SEMICONDUCTOR OY, Tampere (FI)

( * ) Notice: Subject to any disclaimer, the term of this patent is extended or adjusted under 35 U.S.C. 154(b) by 69 days.

(21) Appl. No.: 17/558,634

(22) Filed: Dec. 22, 2021

(65) Prior Publication Data

US 2022/0140070 A1    May 5, 2022

Related U.S. Application Data (63) Continuation of application No. PCT/FI2020/050443, filed on Jun. 22, 2020, which is a continuation of
(Continued)

(51) Int. Cl.
*H01L 23/522* (2006.01)
*H01L 23/66* (2006.01)
(Continued)

(52) U.S. Cl.
CPC .......... *H01L 28/88* (2013.01); *H01L 23/5223* (2013.01); *H01L 23/5226* (2013.01);
(Continued)

(58) Field of Classification Search
CPC ......... H01L 28/88; H01L 28/87; H01L 28/86; H01L 28/90; H01L 28/91; H01L 28/40;
(Continued)

(56) References Cited

U.S. PATENT DOCUMENTS 6,542,351 B1    4/2003  Kwang
6,690,570 B2    2/2004  Hajimiri et al.
(Continued)

FOREIGN PATENT DOCUMENTS

CN    102456665 B    6/2016
TW    201044504 A    12/2010
TW    201432869 A    8/2014

OTHER PUBLICATIONS

Aparicio R et al: "Capacity limits and matching properties of integrated capacitors", IEEE Journal of Solid- State Circuits, IEEE Service Center, Piscataway, NJ, USA, vol. 37, No. 3, Mar. 1, 2002 (Mar. 1, 2002), pp. 384-393, XP002252607, ISSN: 0018-9200, DOI: 10.1109/4.987091.
(Continued)

*Primary Examiner* — Omar F Mojaddedi
(74) *Attorney, Agent, or Firm* — Robert P. Michal, Esq.; Carter, DeLuca & Farrell LLP (57) ABSTRACT

A capacitor structure implemented as a layered structure including a plurality of alternating dielectric and metallization layers, and a method of manufacturing such capacitor structure. The capacitor structure including at least one lateral parallel plate capacitor part (LPP part) including two first electrodes on two different layers separated by dielectric material of a plurality of the alternating layers, and at least one vertical parallel plate capacitor part (VPP part) including two second electrodes each including a plurality of superimposed slabs or bars arranged on a plurality of the metallization layers. The at least one LPP part is electrically coupled with the at least one VPP part to form the capacitor structure. A variation in capacitance value of the at least one LPP part due to a variation of thickness of dielectric material is at least partially compensated by an opposite variation in capacitance value of the at least one VPP part.

12 Claims, 7 Drawing Sheets

Related U.S. Application Data application No. PCT/FI2019/050513, filed on Jun. 28, 2019.

(51) Int. Cl.
*H01Q 1/22* (2006.01)
*H01Q 1/38* (2006.01)
*H01L 49/02* (2006.01)

(52) U.S. Cl.
CPC .............. *H01L 23/66* (2013.01); *H01L 28/90* (2013.01); *H01L 28/91* (2013.01); *H01Q 1/2283* (2013.01); *H01Q 1/38* (2013.01); *H01L 2223/6677* (2013.01)

(58) Field of Classification Search
CPC . H01L 28/60; H01L 23/5223; H01L 23/5226; H01L 23/66; H01Q 1/38; H01Q 1/2283
See application file for complete search history.

(56) References Cited

U.S. PATENT DOCUMENTS

| | | |
|---|---|---|
| 6,969,680 B2 | 11/2005 | Paul et al. |
| 2010/0123213 A1 | 5/2010 | Chen et al. |
| 2014/0103490 A1* | 4/2014 | Kumar .................... H01L 28/86 257/532 |
| 2014/0203401 A1* | 7/2014 | Li .......................... H01L 28/91 257/532 |
| 2014/0203404 A1 | 7/2014 | Choi et al. |
| 2014/0264742 A1* | 9/2014 | Yen ......................... H01L 28/86 257/532 |
| 2015/0022948 A1* | 1/2015 | An ....................... H01L 23/5223 361/303 |
| 2016/0163692 A1* | 6/2016 | Moghe ................ H01L 23/5223 257/503 |

OTHER PUBLICATIONS

International Search Report issued by the European Patent Office acting as the International Searching Authority in relation to International Application No. PCT/FI2020/050443 dated Sep. 24, 2020 (4 pages).

Written Opinion of the International Searching Authority issued by the European Patent Office acting as the International Searching Authority in relation to International Application No. PCT/FI2020/050443 dated Sep. 24, 2020 (8 pages).

International Preliminary Report on Patentability issued by the European Patent Office acting as the International Preliminary Examining Authority in relation to International Application No. PCT/FI2020/050443 dated Oct. 19, 2021 (8 pages).

Taiwanese Office Action and Search Report issued by the Taiwanese Intellectual Property Office in relation to Taiwan Application No. 109121607 dated Jun. 21, 2021 (9 pages) along with English language translation (7 pages).

* cited by examiner

Prior art

Prior art

CAPACITOR STRUCTURE

FIELD

The present invention relates to a capacitor device structure and a method for manufacturing such structure.

BACKGROUND

Figure 1A:
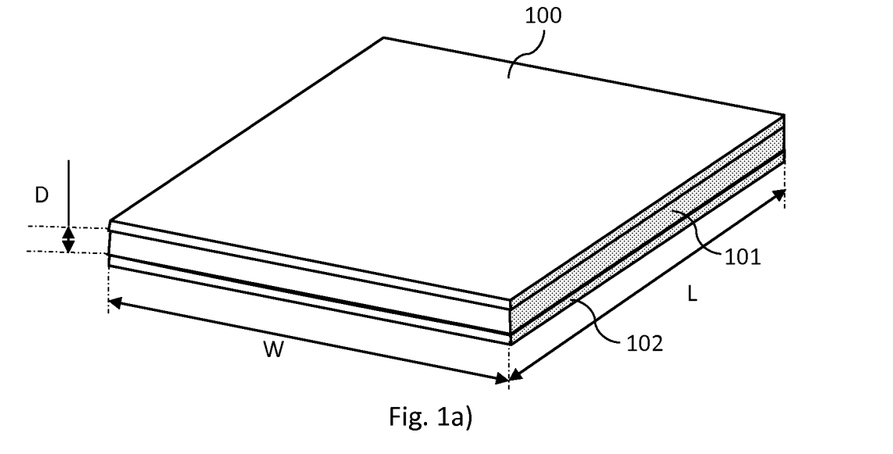
FIGS. 1a and 1b illustrate a lateral parallel plate capacitor.

FIG. 1a shows a parallel plate capacitor with two laterally oriented conductor plates having a conductor plate length L, conductor plate width W and vertical distance between two plate electrodes (100, 102) is D. A gap between the first plate electrode (100) and the second plate electrode (102) is filled with dielectric medium (101) having thickness D and relative permittivity of $\in_r$ and $\in_0$ is constant for permittivity of vacuum. Capacitance of the parallel plate capacitor is given by equation:

$$C = \in_0 \times \in_r \times (W \times L)/D \quad (1)$$

In semiconductor industry, when insulator is used as the dielectric medium (101), this kind of capacitor is commonly manufactured by placing one or more layers of insulator material between two flat sheets of metal, and thus it is commonly called as a Metal-Insulator-Metal (MIM) capacitor. This type of capacitor may be referred to as a horizontal capacitor or a lateral capacitor, since the conductor plates extend in the horizontal direction, which may also be considered as the lateral direction.

Figure 1B:
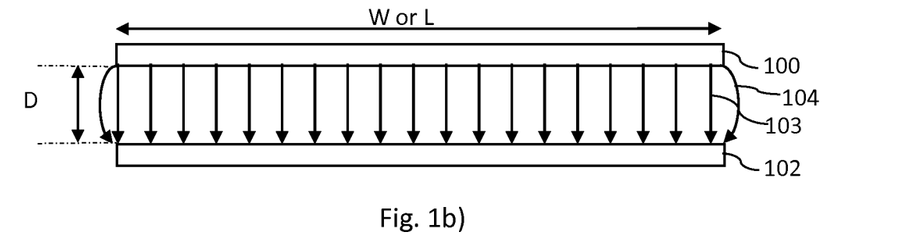

The equation (1) is substantially accurate when dimensions of the plate electrodes (100, 102), in particular its width (W) and length (L) are both clearly greater than distance (D), because in this case electric field can be assumed to constant between the plates and any fringing field can in practice be neglected. Because the capacitance is directly proportional to the dimensions W and L and inversely proportional to D, assuming absolute tolerances of W, L and D, are in the same order of magnitude but W and L are both clearly greater than D, most critical dimension from capacitance tolerance point of view is obviously D. FIG. 1b shows a cross-section of the capacitor of the FIG. 1a. The electric flux (103) between the plate electrodes (100, 102) is primarily located between the plate electrodes (100, 102).

Figure 2A:
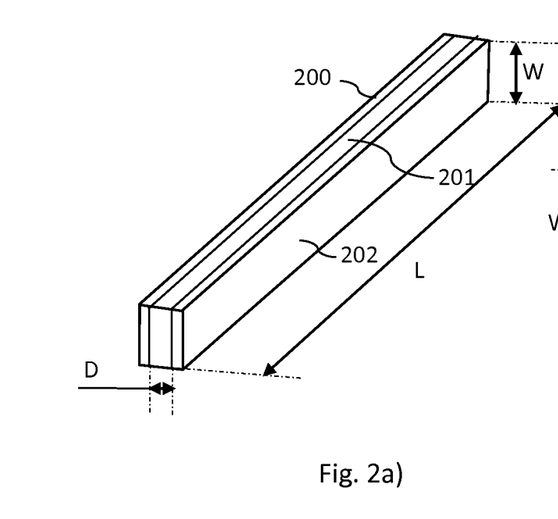
FIGS. 2a and 2b illustrate a vertical parallel plate capacitor

If either width or length of the capacitor plates is not large compared to the distance between the plates, then fringing field (104) around the edges of the capacitor has significant contribution to the total capacitance and should be considered. This is the case with a Vertical Parallel Plate (VPP) capacitor structure show in FIG. 2a. The structure is rotated in comparison to that of the FIG. 1a in a way that direction of electric flux has been rotated 90 degrees and extends between the plates horizontally, while the capacitor plates (200, 202) extend in vertical direction. In this particular case width W of the capacitor plates cannot be considered significantly greater than distance D between the plates (200, 202). An equation (2) corresponding to (1) can still be used for roughly estimating the capacitance.

$$C \approx \in_0 \times \in_r \times (W \times L)/D \quad (2)$$

Figure 2B:
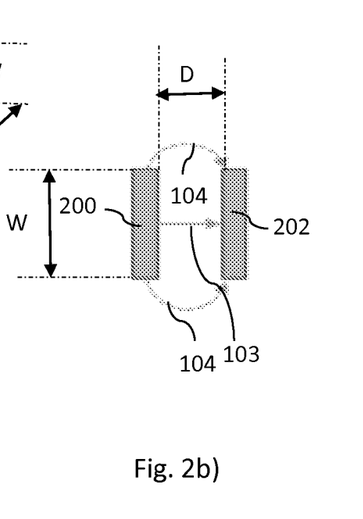

FIG. 2b illustrates a cross-section of the capacitor of the FIG. 2a. Fringing electric field (104) at the edges of the parallel plate electrodes (200, 202) that is not fully perpendicular to the plate electrodes (200, 202) has more significant effect on the total capacitance.

Fringing capacitances can be even bigger than direct capacitance depending on the shapes of the metal plate electrodes and distance between plate electrodes. In typical interconnection lines of integrated circuits fringing capacitances dominate since those lines are usually long and narrow.

Various manufacturing methods for producing capacitors on semiconductor device structures are known, but in many cases capacitor structures are made using a high dielectric material, in other words a material with high dielectric constant, such as ceramic, glass or sapphire to reduce the physical size of the capacitor. Also, silicon oxide may be used as dielectric material. With high dielectric material we refer to materials with relative permittivity that is at least 4. By using high dielectric material, capacitors will have higher capacitance density, thus enabling smaller size to achieve required capacitance. A semiconductor device may thus comprise both semiconductor layers and a layered structure with alternating dielectric and metallization layers, wherein at least one capacitor structure is comprised in the layered dielectric-metallization structure that is arranged on top of the semiconductor device part. In a typical device, semiconductor layers reside below the dielectric and metallization layers, which may provide for example wiring and passive components needed in the circuitry Metallization layers comprise metallized patterns surrounded by dielectric material. One or more intermediate layers may be provided between the semiconductor layers and the layered dielectric-metallization structure, as known in the art. Intermediate layers may for example comprise polysilicon layers and/or silicon oxide layers.

DESCRIPTION OF THE RELATED ART

U.S. Pat. No. 6,690,570 B2 discloses a vertical parallel plate capacitor defined by interdigitated vertical plate electrodes formed by conductor layers coupled with each other with electrically conducting vias.

U.S. Pat. No. 6,542,351 B1 discloses a capacitor structure that comprises a comb-like structure in a first plane with electrode fingers extending between one another in alternating fashion, and additional electrode sets are defined on at least one additional plane lying substantially parallel to the first plane. By adjusting placement of the different polarity electrode fingers on different layers, variation of capacitance due to changes in interlayer dielectric thickness is decreased.

Patent application US20100123213 A1 discloses a capacitor formed in a dielectric stack in an integrated circuit that contains metal lines and metal plates in alternating metal interconnect layers.

U.S. Pat. No. 6,969,680 B2 discloses a capacitance formed by layers of conductive strips on a substrate and conductive plates above and below the strip structure for providing shielding.

Patent application US2015/0022948 A1 discloses a capacitor structure with negative and positive electrode fingers stacked alternately and repeatedly.

Current state of art capacitors have quite large tolerances, which are caused for example due to variation in layer thicknesses in manufacturing process.

Area consumed by capacitors is one major design restriction. One known method to improve capacitance density is to use a plurality of interdigitated electrode fingers as for example in the above referred state of art. However, due to manufacturing process variations of this type of capacitor devices, capacitance value tolerances of this type of capacitors are large. In other words, accuracy of the capacitance values is fairly poor, which causes challenges in manufacturing mass-produced devices for applications that require accurate capacitor values. Chip antennas and capacitors used for antenna matching in radio devices are typical examples of such applications.

Individual selection of capacitors is not commercially feasible in mass production. One known solution is to perform trimming of capacitors, which is somewhat more useful, but requires time and resources and thus adds cost. Thus, there is a need for controlling variance of capacitance values in a large amount of capacitor devices in cost-efficient way.

Figure 3:
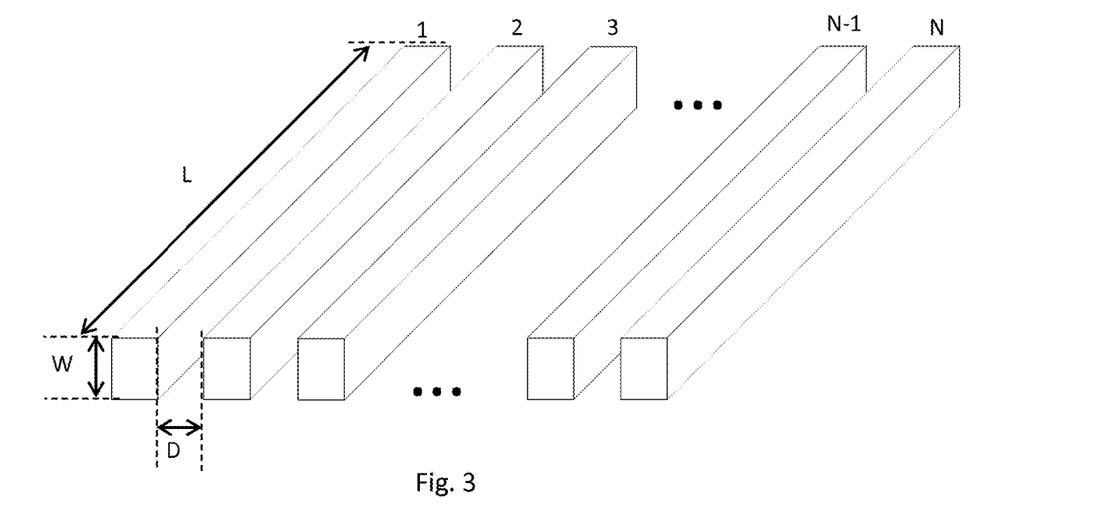
FIG. 3 illustrates a vertical capacitor structure with a plurality of vertical plate electrodes.

FIG. 3 illustrates a vertical capacitor structure with N electrode fingers. Each of the electrode fingers forms a capacitive plate pair with the one or two adjacent electrode fingers, and total capacitance of the vertical capacitor structure is achieved as combination of all adjacent vertically oriented capacitor plate pairs. In the example of FIG. 3, the exemplary arrangement has odd electrode fingers 1, 3, 5, . . . forming together one electrode and even electrode fingers 2, 4, 6, . . . forming together the other electrode. Distance D between any two adjacent electrode fingers may be equal or it may vary. In a typical vertical capacitor design, distances D between electrode fingers are equal. However, there is no requirement to make the distances equal, and a modern simulation tool calculates easily and accurately nominal capacitance of any kind of capacitor structure.

Figure 4A:
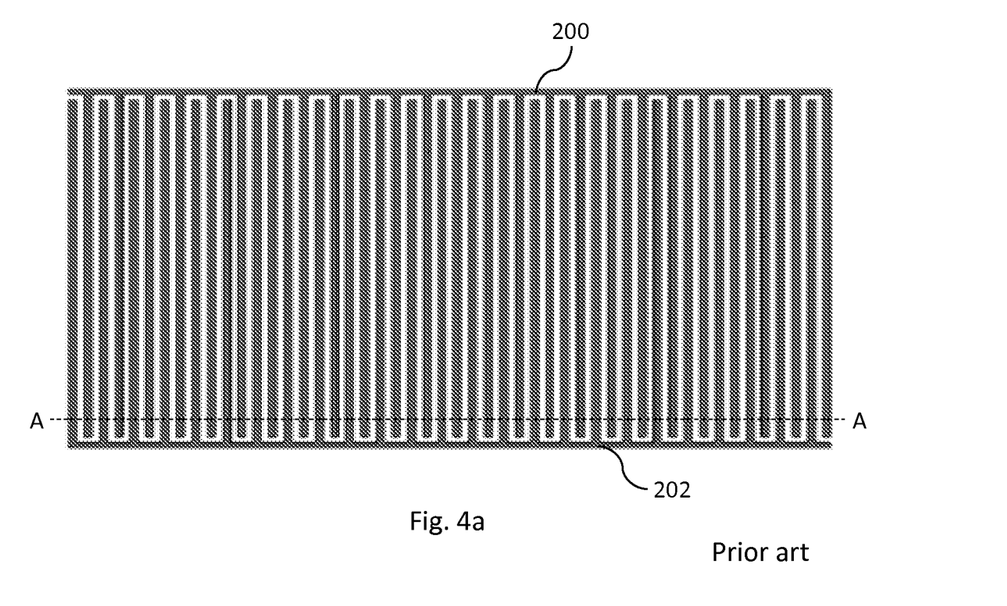
FIGS. 4a and 4b illustrate a vertical parallel plate capacitor.
Figure 4B:
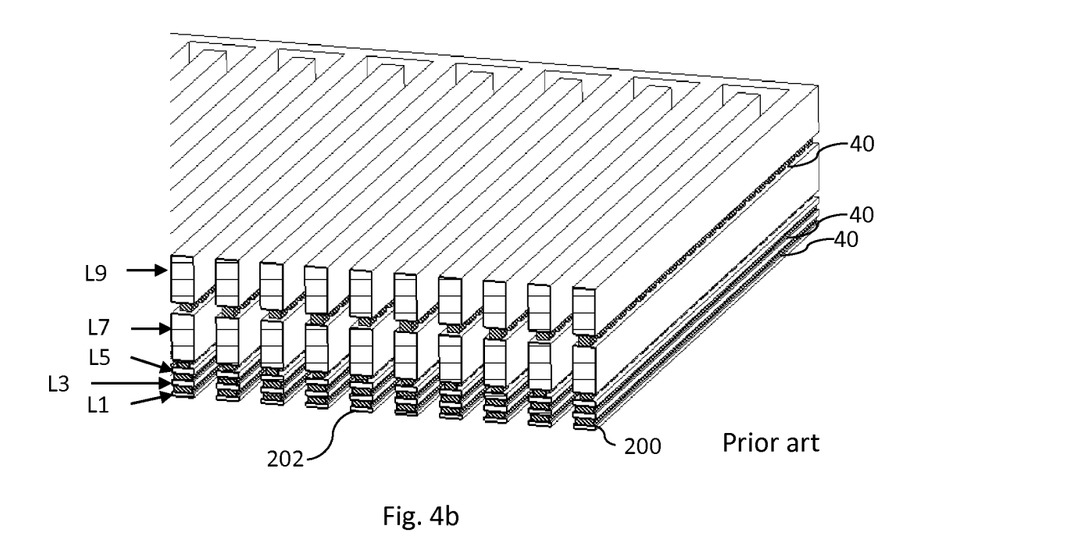

FIG. 4a illustrates a top view of a metallization pattern of an exemplary vertical parallel plate capacitor in which positive and negative electrodes (200, 202) comprise a pattern of stacked interdigitated metal electrode fingers with a plurality of vias connecting superimposed metallization layers together. Dielectric material between the structures is not shown. FIG. 4b shows a perspective view of the metal parts of the same structure, along cutting line A-A shown in the FIG. 4a. This view shows a plurality of metallization layers (L1, L3, L5, L7, L9) and interconnecting vias (40) between the slabs or bars formed on these metallization layers. This structure is in principle similar to U.S. Pat. No. 6,690,570 referred earlier. Vertical stacks of the exemplary device comprise two thick metallization layers (L7, L9) and three thinner metallization layers (L1, L3, L5).

The layer structure shown in the FIG. 4b which is typical for example for radio frequency integrated circuit back end of line (RFIC BEOL) metallization with thick metal options, in which the thick metal layers are useful for example for creating low loss RF coils or transmission lines. There are also multiple thinner layers (L1, L3, L5) for less critical fine pitch routing and connections for semiconductor devices. Unfortunately, this kind of layer structure is not necessarily optimal layer structure in view of manufacturing tolerances, because the two thick metallization layers (L7, L9) will likely dominate in thickness variation, which contributes to increased capacitance variation. These characteristics cause such vertical parallel plate capacitor type not to be suitable as such for example for antennas and/or antenna interfaces, in which accurate capacitor values are needed.

SUMMARY

An object is to provide a capacitor structure that is less susceptible to variation in capacitance value due to variation in thickness of material layers of the multi-layered structure. The objects of the present invention are achieved with a capacitor structure according to the characterizing portion of claim 1 and an electronic device according to claim 9. The objects are further achieved with a method of manufacturing a capacitor structure according to claim 10, and a method for manufacturing an electronic device according to claim 11.

The preferred embodiments of the invention are disclosed in the dependent claims.

The present invention is based on the idea of a combined capacitor structure that has both vertical parallel plate capacitor parts and lateral parallel plate capacitor parts. In such combined capacitor structure changes in capacitance of the vertical and lateral parts due to manufacturing tolerances, in particular due to changes in variation in thickness of dielectric and/or metallization layers of the capacitor structure, effectively cancel each other. Generally, metal patterning on the metallization layers can be made into many shapes, but normally narrow lines, slabs or bars or rectangular plates are used for both interconnections and capacitors, and dielectric material surrounds the metal patterns in the respective metallization layer. These shapes are used in the following description, but other shapes are not excluded.

According to a first aspect, a capacitor structure is provided that is implemented as a layered structure comprising a plurality of alternating dielectric and metallization layers. The capacitor structure comprises at least one lateral parallel plate capacitor part (LPP part) comprising two first electrodes formed by two essentially parallel metallization patterns in two different layers separated by dielectric material of a plurality of said alternating layers, and at least one vertical parallel plate capacitor part (VPP part) comprising two second electrodes each comprising a plurality of superimposed slabs or bars arranged in a plurality of said metallization layers. The at least one LPP part is electrically coupled with the at least one VPP part to form the capacitor structure. A variation in capacitance value of the at least one LPP part due to a variation of thickness of dielectric material on at least one of said plurality of alternating layers separating the two first electrodes, which variation of thickness causes a difference in distance between said two first electrodes in vertical dimension from a nominal value, is at least partially compensated by an opposite variation in capacitance value of the at least one VPP part due to the same variation of thickness of the same at least one of said plurality of alternating layers, due to the same variation of thickness causing a difference in width of the two second electrodes in vertical dimension from a nominal value.

According to a second aspect, the at least one LPP part and the at least one VPP part are electrically coupled to each other in parallel or in series.

According to a third aspect, the capacitor structure comprises at least two LPP parts and at least two VPP parts, wherein at least one LPP part and at least one VPP part are electrically coupled to each other in parallel and wherein at least one other LPP part and at least one other VPP part are electrically coupled to each other in series.

According to a fourth aspect, both of said second electrodes comprise a plurality of electrode fingers each formed by a plurality of superimposed slabs or bars, the electrode fingers of the two second electrodes forming a comb structure with interdigitated electrode fingers, in which adjacent electrode fingers have alternating polarities, and/or said superimposed slabs or bars are electrically connected to each other with one or more electrically conducting vias traversing through each dielectric material layer separating two adjacent metallization layers comprising said superimposed slabs or bars.

According to a fifth aspect, said two first electrodes reside in metallization layers of the capacitor structure that comprise the top and bottom slabs or bars of said second electrodes, which top and bottom slabs or bars define width of said second electrodes in vertical dimension.

According to a sixth aspect, one of said two first electrodes resides in a layer of the capacitor structure that is in vertical dimension above the metallization layer that comprises slabs or bars of said second electrodes defining the upper limit of the width of the second electrodes in vertical dimension, and the other of said two first electrodes resides in a layer of the capacitor structure that comprises slabs or bars of said second electrodes defining the lower limit of the width of the second electrodes in vertical dimension. Alternatively, one of said two first electrodes resides in a layer of the capacitor structure that is in vertical dimension below the metallization layer that comprises slabs or bars of said second electrodes defining the lower limit of the width of the second electrodes in vertical dimension and the other of said two first electrodes resides in a layer of the capacitor structure that comprises slabs or bars of said second electrodes defining the upper limit of the width of the second electrodes in vertical dimension.

According to a seventh aspect, one of said two first electrodes resides in a layer of the capacitor structure that is in vertical dimension above the metallization layer of the capacitor structure that that comprises slabs or bars of said second electrodes defining the upper limit of the width of the second electrodes in vertical dimension, and the other of said two first electrodes resides in a layer of the capacitor structure that is in vertical dimension below the metallization layer of the capacitor structure that comprises slabs or bars of said second electrodes defining the lower limit of the width of the second electrodes in vertical dimension.

According to an eighth aspect, vertical distance between adjacent faces of said two first electrodes is defined by thickness of layers that define width of said two second electrodes in vertical dimension.

According to another aspect, an electronic device is provided that comprises a semiconductor device structure, optionally one or more intermediate layers on top of the semiconductor device structure, and a capacitor structure according to any one of the above aspects arranged either on top of the semiconductor device structure or on top of said intermediate layers.

According to a first method aspect, a method for manufacturing a capacitor structure is provided, wherein the capacitor structure is a layered structure comprising a plurality of alternating dielectric and metallization layers.

The method comprises, during the manufacturing process, generating at least one lateral parallel plate capacitor part (LPP part) comprising two first electrodes by forming two essentially parallel metallization patterns in two different layers of the capacitor structure, wherein said two first electrodes are separated by dielectric material of a plurality of said alternating layers, and generating at least one vertical parallel plate capacitor part (VPP part) comprising two second electrodes by creating a plurality of superimposed slabs or bars on a plurality of said metallization layers, and electrically coupling the at least one LPP part with the at least one VPP part to form the capacitor structure. A variation in capacitance value of the at least one LPP part due to a variation of thickness of dielectric material on at least one of said plurality of alternating layers separating the two first electrodes, which variation of thickness causes a difference in distance between said two first electrodes in vertical dimension from a nominal value, is at least partially compensated by an opposite variation in capacitance value of the at least one VPP part due to the same variation of thickness of the same at least one of said plurality of alternating layers, due to the same variation of thickness causing a difference in width of the two second electrodes in vertical dimension from a nominal value.

According to another method aspect, a method for manufacturing an electronic device is provided, the method comprising manufacturing a semiconductor device structure, optionally manufacturing one or more intermediate layers on top of the semiconductor device structure and manufacturing, on top of the semiconductor device structure or on top of said one or more intermediate layers, a capacitor structure according to any of the first to eighth aspects, using the method according to the first method aspect.

Idea of the invention can be implemented various ways with different metal patterning. However, it is essential that the capacitor structure has both a) parts in which capacitance increases as function of layer thickness of the capacitor structure, and b) parts in which capacitance decreases as function of layer thickness of the capacitor structure, and that the layer thicknesses on these parts are at least partially, preferably predominantly, defined by the same layers. This enables compensation of variance of total capacitance of the capacitor structure due to variation of layer thickness. Ideally such compensation would cover all the used layers and all parts of the capacitor structure, but in a typical case, variation of all layers cannot be included in the compensation scheme. For example, there may be limitations in the manufacturing process used for generating the capacitor structure. However, even partial compensation reduces capacitance variation.

Effects of fringing capacitances are taken into account in the capacitor design so that variance of the capacitance of the capacitor structure remains within wanted tolerance range. Modern design tools enable taking fringing capacitances in account for example through accurate simulations.

The present invention has the advantage that capacitance tolerance of the capacitor structure according to the invention is improved. In other words, capacitance values of capacitors with the invented capacitor structure are accurate without individual selection or trimming. The invented capacitor structure advantageously compensates effects of variation of layer thicknesses on the capacitance values due to manufacturing tolerances, thus reducing capacitance variation.

BRIEF DESCRIPTION OF THE DRAWINGS

In the following the invention will be described in greater detail, in connection with preferred embodiments, with reference to the attached drawings, in which.

DETAILED DESCRIPTION

Terms variation and change refer to a situation in which a value of a physical quantity is different from its nominal value. For example, variation or change of a thickness of a layer due to manufacturing tolerances means that thickness of the layer in a final product is different from the nominal value that was used in the design to achieve wanted characteristics of associated physical quantities. Likewise, variation or change of a capacitance value due to variation of thickness of layers means that the capacitance value is different from the nominal value that would be achieved, if all layers had their nominal thickness as used in designing the capacitor.

As known in the art, a metal-dielectric device is typically manufactured in layers. In a layered structure, both terms lateral and horizontal are commonly used to refer to a structure or a field, such as an electric field, that extends along a layer of material. A lateral structure may be arranged between other lateral layers or it may extend along a lateral surface of the layered structure. Correspondingly, term vertical is used to refer to a structure or a field that extends in a direction perpendicular to a lateral layer. In a layered structure, a vertical structure comprises portions that are arranged at a plurality of superimposed material layers and the vertical structure thus extends over a plurality of material layers. A vertical structure may traverse vertically through or between at least some of the plurality of material layers, and there may be connecting parts like vias in any intermediate layers. A vertical structure may comprise several superimposed portions on different material layers. Lateral and vertical structures thus have essentially 90-degree transpose. Likewise, lateral and vertical fields have essentially 90-degree transpose.

Two adjacent vertical structures may be used for generating a lateral capacitance, in which a lateral electric field may be generated between the two vertical structures. Two lateral metal patterns superimposed on two different, vertically separated layers generate a vertical capacitance, in which a vertical electric field may be generated between two lateral metal patterns. For achieving benefits of the invention, it is beneficial to maximize number of layers, which affect both on the lateral capacitance of a vertical parallel plate capacitor part and the vertical capacitance of a lateral parallel plate capacitor part.

The term lateral parallel plate capacitor part (LPP part) refers to a capacitor part that is of parallel plate capacitor type and comprises two lateral parallel plate electrodes, and the term vertical parallel plate capacitor part (VPP part) refers to a capacitor part that is of parallel plate type, and which may comprise two vertical parallel plate electrodes or more than two interdigitated vertical parallel plate electrode fingers, which may be referred in short as vertical electrode fingers. Vertical parallel plate electrodes and vertical electrode fingers typically comprise a plurality of superimposed metallized slabs or bars, but may even be formed on a single metallization layer.

In the following, some basic properties and principles of the embodiments with help of FIGS. 5 to 9 will be explained. The drawings are not in scale, and scales used in lateral and vertical dimensions may differ. Also, although layers of the capacitor structure are shown with approximately equal thickness in vertical direction, embodiments are not limited to a any particular number of layers in the structure, nor to a structure with equally thick layers, but the principle is applicable to any number of a plurality of layers and any combination of layer thicknesses, like the one shown in the FIG. 4b. Horizontal dotted lines represent limits of dielectric and metallization layers.

Figure 5:
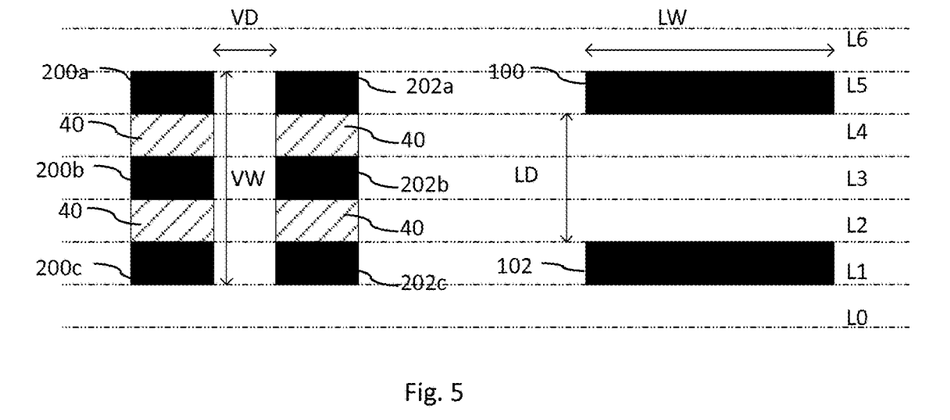
FIG. 5 illustrates a cross-section of a device with a lateral and a vertical parallel plate capacitor part according to a first embodiment.

FIG. 5 illustrates a cross section of a capacitor structure with a VPP part and a LPP part according to a first embodiment. The capacitor device comprises a plurality of layers (L0, L1, L2, . . . . L6). Although the example shows seven layers, any number of layers is applicable. In particular, more than seven layers may be applied. Metallized electrode plates (100, 102) of the LPP part and metallized slabs or bars (200a-c, 202a-c) of the electrodes of the VPP part are arranged on the odd numbered layers L1, L3 and L5, these layers may be commonly referred to as the metallization layers. Metal patterns are surrounded by dielectric material in the metallization layer. Even numbered layers L0, L2, L4, L6 may be referred to as dielectric layers, since these layers mainly comprise non-conductive dielectric material, such as glass, ceramic, sapphire or oxide material.

In the first embodiment, the superimposed slabs or bars of the VPP part are coupled to each other with one or more metallized vias (40) extending through an intermediate dielectric layer between two metallization layers. Shape, size, number and positioning of the vias (40) between the slabs or bars is a design option.

In the following embodiment, we will use references LD and VD for referring to distance (D) between the electrodes, references LW and VW for referring to width (W) of the electrodes and references LL and VL for referring to length of the LPP part and the VPP part, respectively.

In the first embodiment, distance LD between the positive and negative plate electrodes (100, 102) of the LPP part is defined by thickness of the three layers (L2, L3, L4) in between the plate electrodes. If one or more of these intermediate layers is thicker than intended, distance (LD) between the lateral plate electrodes (100, 102) of the LPP part will increase, which will decrease the achieved capacitance according to equation (1). On the other hand, the same increase in the thickness of one or more of these intermediate layers (L2-L4) also increases width (VW) of the the VPP part, which effectively increases the area of the electrodes of the VPP part and therefore increases the capacitance value of the VPP part.

By suitably dimensioning and combining the LPP and VPP parts, these changes in capacitance values compensate at least major share of each other. Variation of the capacitance values due to the variation of thickness of the layers will affect on the capacitance of both capacitor parts, but in opposite direction. Nominal capacitance values of the LPP part and the VPP part may be designed to fulfill requirements of total required capacitance value, available area as well as to take into account fringing capacitance effects. Nominal capacitance values refer to capacitance values that are achieved with nominal layer thicknesses and nominal lateral dimensions of metallized parts of both capacitor parts.

In the first embodiment, variation of thickness of the metallization layers L1 and L5, on which the electrodes of the LPP part reside, do not have any major effect on the capacitance of the LPP part, but will have an effect on the capacitance of the VPP part. Although effect of variation of thickness of layers L1 and L5 cannot be compensated, this arrangement enables compensation of capacitance variation which is sufficient in some applications.

For utilizing the compensation effect, the VPP part and the LPP part shall be electrically combined with each other, so that the total achievable capacitance value of the capacitor structure is defined on basis of capacitances of both VPP and LPP part. For maximising the achievable capacitance value, thus maximising achievable capacitance density, it is beneficial to couple the two capacitor parts in parallel. However, same basic principle for compensation of change in capacitance applies if the LPP and VPP parts are coupled in series.

Change in capacitance due to a change $\Delta t$ in layer thickness in layers between the electrodes of the LPP part may be expressed mathematically as follows. Change of the capacitance $\Delta C_{vert}$ of the VPP part may be expressed with function:

$$\Delta C_{vert} \approx \varepsilon_0 * \varepsilon_r * \left(\frac{(VW + \Delta t) * VL}{VD} - \frac{VW * VL}{VD}\right) = \frac{\varepsilon_0 * \varepsilon_r * \Delta t * VL}{VD} \quad (3)$$

Change of the capacitance of the LPP part due to the same change $\Delta t$ in layer thickness may be expressed with function:

$$\Delta C_{lat} \approx \varepsilon_0 * \varepsilon_r * \left(\frac{LW * LL}{LD + \Delta t} - \frac{LW * LL}{LD}\right) = -\frac{\varepsilon_0 * \varepsilon_r * \Delta t * LW * LL}{LD * (LD + \Delta t)} \quad (4)$$

When the LPP and VPP parts are connected in parallel, approximate effect of a change $\Delta t$ in distance LD, and thus also change in width VW on the total capacitance can thus be expressed with function:

$$\Delta C_{tot} \approx \Delta C_{vert} + \Delta C_{lat} \approx \varepsilon_0 * \varepsilon_r * \Delta t * \left(\frac{VL}{VD} - \frac{LW * LL}{LD * (LD + \Delta t)}\right) \quad (5)$$

This simplified equation does not take into account any change in the fringing capacitances. In case of coupling the capacitor parts in series, combined effect of the change $\Delta t$ in distance LD and in width VW on the total capacitance can thus be expressed with function:

$$\Delta C_{tot} \approx C_{\Delta t} - C_0 \approx \quad (6)$$
$$\varepsilon_0 * \varepsilon_r * \left(\frac{LW * LL * (VW + \Delta t) * VL}{LW * LL * VD + (VW + \Delta t) * VL * (LD + \Delta t)} - \frac{LW * LL * VW * VL}{LW * LL * VD + VW * VL * LD}\right)$$

Figure 6:
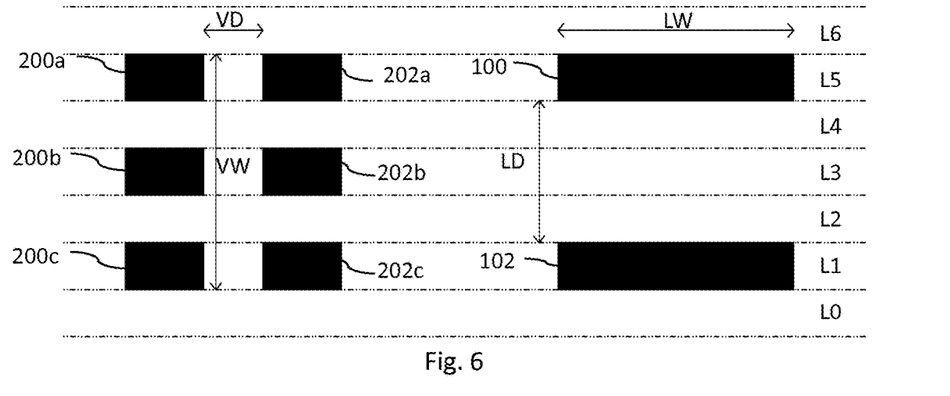
FIG. 6 illustrates a cross-section of a device with a lateral and a vertical parallel plate capacitor parts according to a second embodiment.

FIG. 6 illustrates a schematic cross section of a capacitor structure with a VPP part and a LPP part according to a second embodiment, which differs from the first embodiment in that there are no vias between the slabs or bars (200a-c, 202a-c) of the VPP part. Major part of the electrical fields in the VPP part will occur between adjacent slabs or bars that reside in the same layer, namely 200a and 202a, 200b and 202b, and 200c and 202c. Change in thickness of one or more intermediate layers (L2 to L4) between the electrodes of the LPP part changing the distance (LD) between the plate electrodes (100, 102) will cause similar changes in effective width (VW) of the VPP part, similar to the first embodiment. For implementing a single VPP part with two electrodes, bars and slabs (200a, 200b, 200c; 202a, 202b, 202c) of each electrode are to be mutually electrically connected (not shown). This mutual connection may be established in any part of the slabs or bars, for example at or near one end. Although the superimposed slabs or bars (200a, 200b, 200c; 202a, 202b, 202c) are electrically separated by dielectric layers at majority of their length, they are thus electrically coupled to form two electrodes of a VPP part and may therefore be considered as a variation of a vertical parallel plate capacitor type, and may thus be referred to as a VPP part. Mutually coupled superimposed slabs or bars (200a, 200b, 200c; 202a, 202b, 202c) may thus be considered to form a vertical plane electrode with holes in it. Each superimposed bar or slab has the same potential and an electric field is formed between the superimposed bars of slabs at one vertical plane and the slabs or bars of at an adjacent vertical plane. This kind or arrangement will have more significant fringing field effects than the first embodiment. In this case the capacitance of the VPP part is based on both lateral electric fields between opposite faces of adjacent slabs or bars and fringing fields of revealed edges of slabs or bars. Effects of the fringing capacitances may be taken into account in the design of the device so that compensation of changes in the layer thicknesses can be implemented. Design issues related to fringing capacitances are not in focus of this invention and therefore not discussed here in detail, but they, as well as design methods for capacitors which take into account fringing capacitances, are well known to persons skilled in the art. Total capacitance achieved with this type of electrodes is somewhat less than that achieved with solid plate electrodes.

Figure 7:
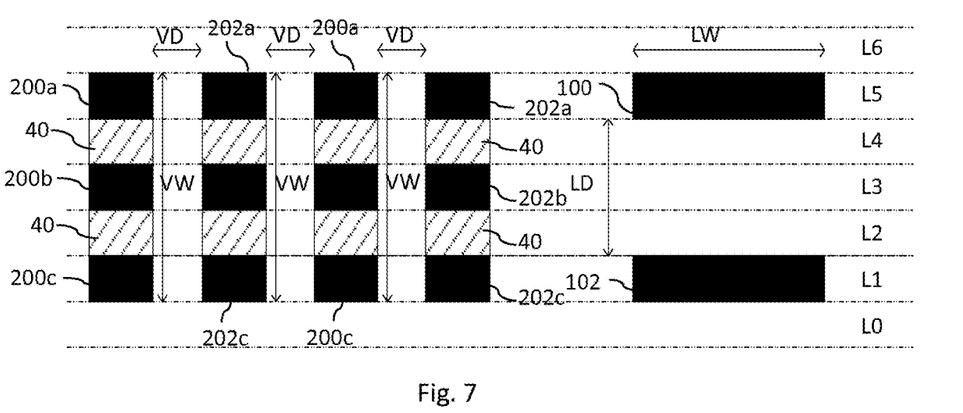
FIG. 7 illustrates a cross-section of a device with a lateral and a vertical parallel plate capacitor part according to a third embodiment.

FIG. 7 illustrates a schematic cross section of a capacitor structure with a VPP part and a LPP part according to a third embodiment. In comparison to the first embodiment, the VPP part now has more than two vertical electrode fingers, which may be arranged as interdigitated electrode fingers for example in an arrangement with alternating polarity as shown in the FIG. 4a. Although four vertical electrode fingers are shown in this illustration, any number of vertical electrode fingers may be applied according to design. An interdigitated VPP part structure as illustrated in the FIG. 7 and also in the FIGS. 4a and 4b is commonly referred in the art as a VPP capacitor, and it is referred to as a vertical parallel plate capacitor part (VPP part) in context of this application. Distances VD between different pairs of adjacent electrode fingers may be equal, but they may also vary according to design. For implementing a single VPP part, electrode fingers may be mutually connected for example only at or near one end. According to a further alternative, also the third embodiment may be implemented without the plurality of vias (40) between the slabs or bars of the electrode fingers of the VPP part as explained in relation to the FIG. 6. For implementing a single VPP part, bars and slabs (200a, 200b, 200c; 202a, 202b, 202c) are electrically coupled to form the two electrodes of the VPP part.

Figure 8:
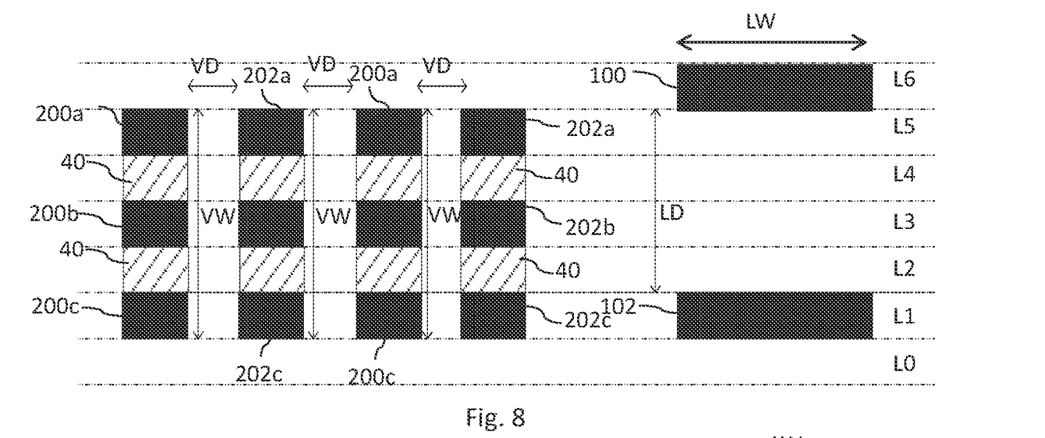
FIG. 8 illustrates a cross-section of a device with a lateral and a vertical parallel plate capacitor part according to a fourth embodiment.

FIG. 8 illustrates a simplified schematic cross section of a capacitor structure with a VPP part and a LPP part according to a fourth embodiment. In this embodiment, the VPP part may remain essentially unchanged if compared to the third embodiment, and any number of vertical electrode fingers may be applied according to design. Design options of this embodiment also comprise any number of interdigitated vertical electrode fingers in a comb arrangement or just two vertical plate electrodes as shown in the first and the second embodiments.

One plate electrode (100) of the LPP part is arranged on the dielectric layer L6. This type of metal pattern arrangement is available in some currently available proprietary manufacturing processes. Further, thickness of the electrode of the LPP part that is arranged on the dielectric layer may be less than thickness of the respective dielectric layer, if the manufacturing process enables creating such metallization structures on primarily dielectric layers. If thickness of the respective metallization layer (L5) varies due to the manufacturing process, this will affect both on the distance (LD) between the plate electrodes (100, 102) of the LPP part, and on width (VW) of the electrodes of the VPP part. Thus, in addition to changes in the layers L2 to L4 included in the compensation scheme in the first to third embodiments, also effect of changes in thickness of the layer L5 will affect physical measures and thus capacitance value of both LPP and VPP capacitor parts, but in opposite direction. Thus, this embodiment includes an additional layer (L5) in the overall capacitance compensation scheme, which further improves compensation capability in comparison to the earlier presented embodiments. Another variant of this embodiment employs the principle disclosed in relation to the VPP part of FIG. 6 without the plurality of vias (40) coupling the slabs or bars.

Figure 9:
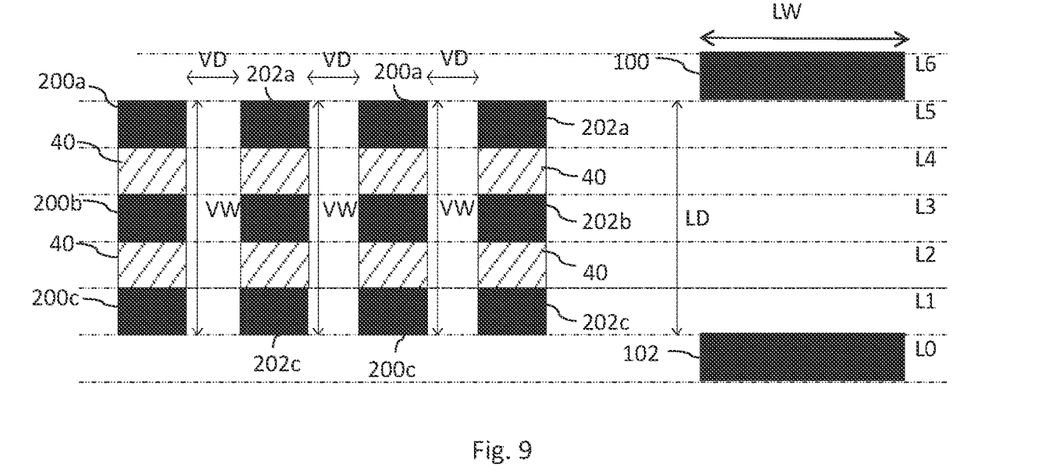
FIG. 9 illustrates a cross-section of a device with a lateral and a vertical parallel plate capacitor part according to a fifth embodiment.

FIG. 9 illustrates a simplified schematic cross section of a capacitor structure with a VPP part and a LPP part according to a fifth embodiment. In comparison to the fourth embodiment, the second plate electrode (102) of the LPP part is arranged on the bottom dielectric layer (L0). This type of metallization pattern arrangement may be enabled in some current or future proprietary manufacturing processes. If thickness of the metallization layer L1 varies due to the manufacturing process, this will additionally affect both on the distance (LD) between the two plate electrodes (100, 102) of the LPP part, and on the width (VW) of the electrodes of the VPP part. Thus, in addition to changes in the layers L2 to L4, also effect of changes in thickness of both layers L1 and L5 will now affect both LPP and VPP parts, but in opposite direction. Thus, this embodiment includes all possible layers (L1-L5) that in this configuration may have an effect in the overall capacitance compensation scheme when thickness of these layers vary due to manufacturing tolerances. In other words distance LD between the electrodes of the LPP part is equal to width VW of the electrodes of the VPP part, and also any change in the distance (LD) and the width (VW) due to changes in thickness of one or more of the layers is equal. Thus, in equations (3) to (6), we can in this case assume that $\Delta t = \Delta LD = \Delta VW$, in other words that $\Delta t$ includes variation of thickness of all layers that define width VW of the VPP part. In comparison to the first to fourth embodiments, capacitance of the LPP part is somewhat lower, since the two plate electrodes (100, 102) of the LPP part are further away from each other. This change may be compensated for example by slightly increasing lateral area of the plate electrodes (100, 102) of the LPP part.

In all embodiments shown in FIGS. 5 to 9, electrodes of the LPP part and the VPP part are preferably arranged laterally on substantially different areas so that they do not mutually overlap. Alternatively, there may be some overlapping of the LPP and VPP parts in lateral dimension, for example by arranging the LPP and VPP parts into L and/or T-shapes, in which a plate electrode the VPP part forms the stem of the T-shape or the L-shape and a plate electrode of the LPP part forms the arm or leg as disclosed in the priority application PCT/FI2019/050513. In such case, the LPP part and the VPP part are effectively electrically coupled in parallel. Yet further, overlapping of the LPP part(s) and VPP part(s) in lateral dimension may be implemented for example using modified L- and/or T-shapes in which the stem is not attached to the arm or leg. Such arrangement allows both parallel and serial coupling of the LPP and VPP parts.

Figure 10:
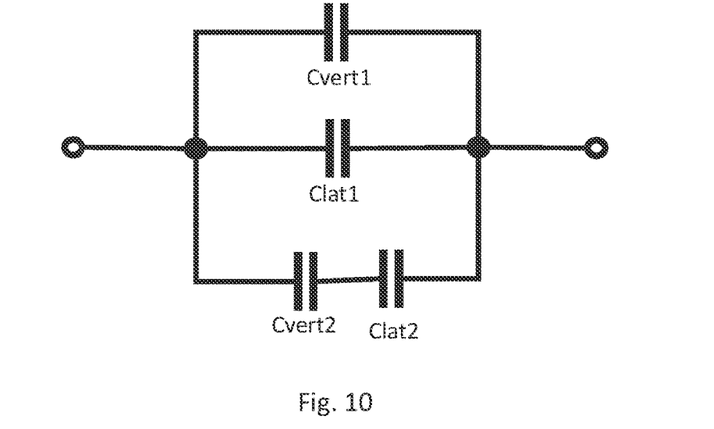
FIG. 10 illustrates schematically mutual couplings between a plurality of lateral parallel plate capacitor parts and vertical parallel plate capacitor parts

FIG. 10 illustrates schematically mutual couplings between a plurality of LPP parts and VPP parts. Total capacitance of the capacitor structure is in this case achieved by combination of all combined capacitor parts, each of which is of either of these types, and where each VPP part is coupled in parallel or in series with a LPP part and vice versa. This example comprises two VPP parts (Cvert1, Cvert2) and two LPP parts (Clat1, Cvlat2), but any number of VPP parts and LPP parts may be applied.

Capacitance accuracy of the capacitor structure, in other words compensation of variance of capacitance value due to layer thickness variation may be further improved by utilizing both parallel and series coupled LPP parts and VPP parts in the same capacitor structure. When LPP part and VPP part are coupled in series, remaining capacitance variation after compensation achieved with the series coupling of a LPP and VPP part has opposite polarity to remaining capacitance variation after compensation achieved with a LPP and VPP part coupled in parallel. By utilizing both parallel and series coupling enabled compensations in the same capacitor structure, remaining uncompensated variation of capacitance value can be thus further reduced. By using either parallel or serial coupling of a single pair of LPP and VPP parts, increased accuracy of the capacitance value is achieved through significant reduction of variation of the capacitance value from the nominal capacitance value. By including both serial coupled and parallel coupled LPP and VPP parts in the same capacitor structure, achieved accuracy of the capacitance value may be further increased. Best compensation results are achieved when all layers affecting capacitance values of the LPP part(s) and VPP part(s) are included in the compensation scheme. Layers of the VPP part not included in the compensation scheme are likely to be the main factor in variation of the capacitance value. When designing a capacitor structure intended to have an accurate capacitance value, also other types of manufacturing tolerances, for example inaccuracies of lateral dimensions of the metallized patterns need to be taken into account. Significant share of inaccuracy in lateral dimensions of a capacitor structure according to the invention may be controlled by selection of distance VD, in other words the distance between adjacent vertical plate electrodes or electrode fingers.

Figure 11:
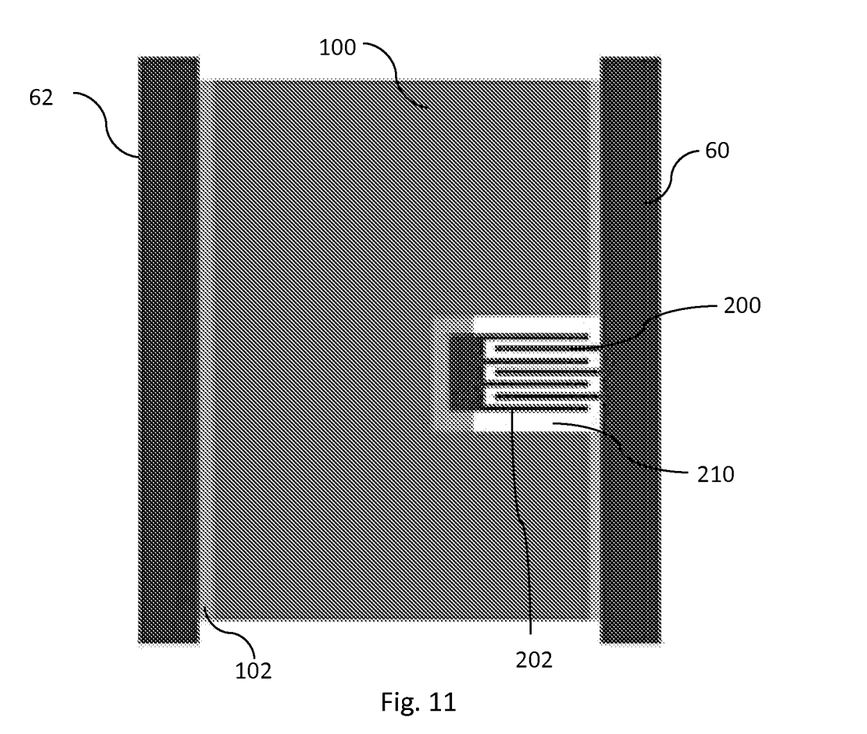
FIG. 11 illustrates a top view of a first non-limiting implementation example.

FIG. 11 shows a top view of a first non-limiting implementation example of a capacitor structure that applies the above illustrated inventive compensation principle. The LPP part comprises a first lateral plate electrode (100) coupled to a first electrical contact (60) and a second lateral plate electrode (102) coupled to a second electrical contact (62). The first lateral plate electrode (100) and the second lateral plate electrode (102) substantially overlap. The VPP part comprises a first vertical electrode (200) coupled to the first electrical contact (60) and a second vertical electrode (202) coupled to the second electrical contact (62). The VPP part (200, 202) comprises an interdigitated comb structure. In this example, electrical contact between the second vertical electrode (202) and the second electrical contact may be implemented via the second lateral plate electrode (102), which is in same electrical potential with the second vertical electrode (202). The LPP part (100, 102) and the VPP part (200, 202) are thus coupled in parallel. In this example, the VPP part (200, 202) is implemented in an opening (210) formed in the otherwise quadrilateral LPP part (100, 102). Electrodes of the LPP part (100, 102) and the VPP part (200, 202) thus do not laterally overlap.

Figure 12:
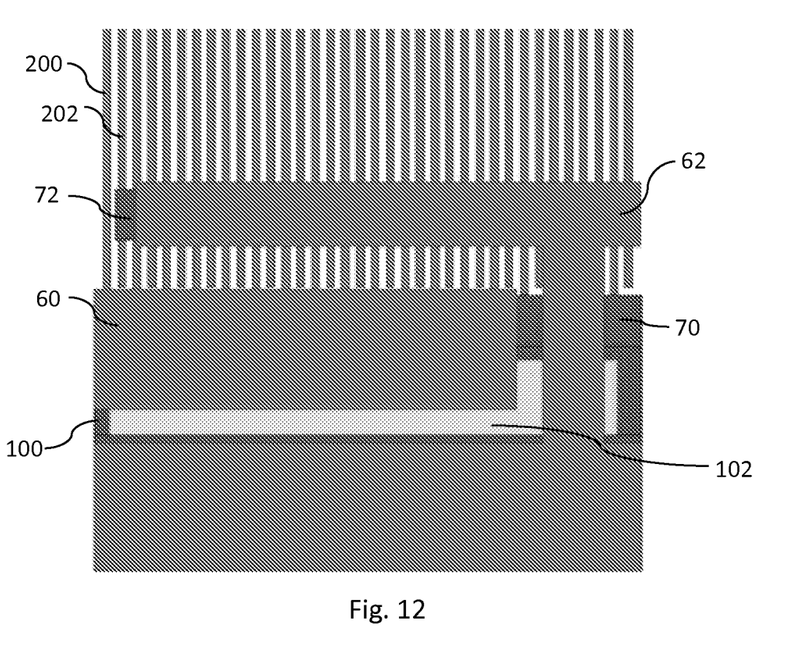
FIG. 12 illustrates a top view of a second non-limiting implementation example.

FIG. 12 illustrates a top view of a second non-limiting implementation example of a capacitor structure that applies the above illustrated inventive compensation principle. The LPP part comprises a first lateral plate electrode (100) coupled to a first electrical contact (60) and a second lateral plate electrode (102) coupled to a second electrical contact (62). The first lateral plate electrode (100) and the second lateral plate electrode (102) hidden in this view underneath other structures have preferably quadrilateral shapes. The VPP part comprises a first vertical electrode (200) coupled to the first electrical contact (60) and a second vertical electrode (202) coupled to the second electrical contact (62). The VPP part (200, 202) comprises an interdigitated comb structure, in which metallized coupling structures (70, 72) provide connections between fingers of the respective electrodes (200, 202). These metallized coupling structures (70, 72) further electrically couple electrodes of the LPP part (100, 102) and the VPP part (200, 202) towards the first and second electrical contacts (60, 62). In this example, the LPP part (100, 102) and the VPP part (200, 202) are coupled in parallel. The VPP part (200, 202) and the LPP part (100, 102) are placed side by side, such that plate electrodes of the LPP part (100, 102) and the VPP part (200, 202) do not laterally overlap. The capacitor structure shown in the FIG. 12 may be redesigned into a series connection of the VPP and LPP parts for example by redesigning the metallized coupling structures (70, 72) and/or the first and second electrical contacts (60, 62).

Figure 13A:
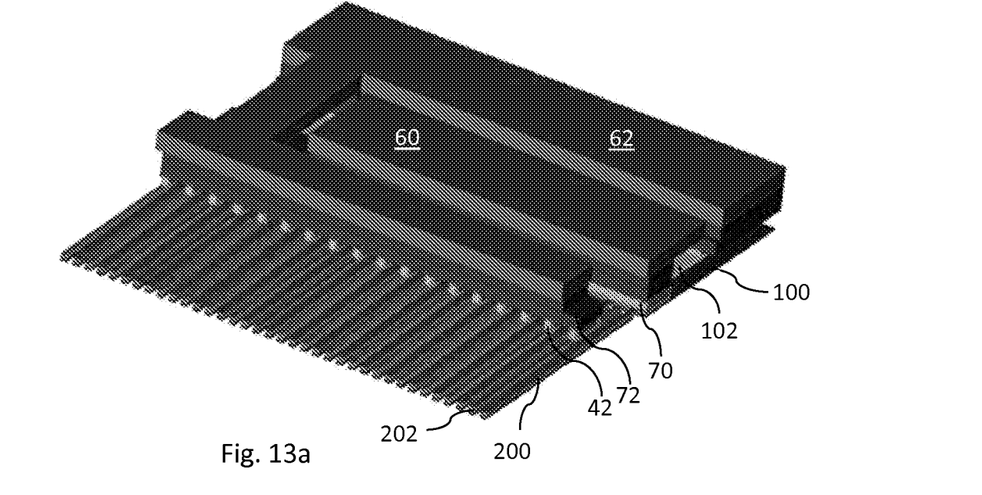
FIGS. 13a and 13b illustrate two different isometric perspective views of the second non-limiting implementation example.
Figure 13B:
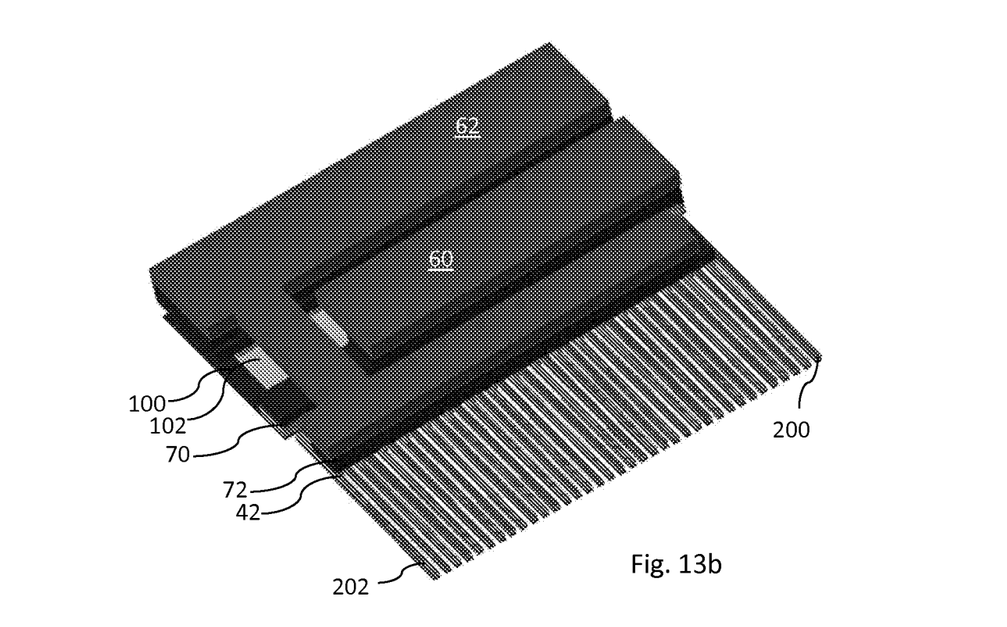

FIGS. 13a and 13b illustrates two different isometric perspective views of the second non-limiting implementation example of a capacitor structure that applies the above illustrated inventive compensation principle. Electrode fingers of the first vertical electrode (200) are mutually electrically coupled with each other at one end of the electrode fingers, and further with the first electrical contact (60) via metallized coupling patterns (70) arranged between the electrodes and the first electrical contact (60). Electrode fingers of the second vertical electrode (202) are mutually electrically coupled with each other with one or more metallized coupling patterns (72). These views show vias (42) for coupling electrode fingers of the second vertical plate electrode (202) with the metallized coupling pattern (72).

In all of the above designs, shape and location of first and second electrical contacts are design options. Electrical contacts for coupling to external circuitry and/or a semiconductor device below the capacitor structure may be provided for example above and/or below the capacitor structure, and/or even at an intermediate layer of the layered structure.

It is apparent to a person skilled in the art that as technology advanced, the basic idea of the invention can be implemented in various ways. The invention and its embodiments are therefore not restricted to the above examples, but they may vary within the scope of the claims.

The invention claimed is:
1. A capacitor structure implemented as a layered structure comprising a plurality of alternating dielectric and metallization layers, the metallization layers comprising metal patterns and dielectric material, wherein the capacitor structure comprises:
  at least one lateral parallel plate capacitor part (LPP part) comprising two essentially parallel first electrodes, the two first electrodes formed by metal patterns in two of the metallization layers, the two first electrodes being separated from each other by dielectric material of a plurality of the alternating layers, and
  at least one vertical parallel plate capacitor part (VPP part) comprising two second electrodes each comprising a plurality of superimposed slabs or bars, each superimposed slab or bar patterned in one of the metallization layers, wherein the plurality of superimposed slabs or bars of each second electrode are electrically coupled with each other by vias, and wherein the at least one VPP part is separate from the at least one LPP part, and
  a first electrical contact and a second electrical contact coupled to the at least one VPP part, wherein each of the two second electrodes of the at least one VPP part is coupled to one of the first electrical contact and the second electrical contact,
  wherein the at least one LPP part is electrically coupled with the at least one VPP part via at least one of the first and second electrical contacts to form the capacitor structure, and wherein a variation in capacitance value of the capacitor structure due to variation of capacitance value of the at least one LPP part due to a variation of thickness of dielectric material in at least one of said plurality of alternating layers separating the two first electrodes, which variation of thickness causes a difference in distance between the two first electrodes in vertical dimension from a nominal value, is substantially compensated by an opposite variation in capacitance value of the capacitor structure due to variation of capacitance value of the at least one VPP part due to the same variation of thickness of the same at least one of said plurality of alternating layers, due to the same variation of thickness causing a difference in width of the two second electrodes in vertical dimension from a nominal value.

2. The capacitor structure according to claim 1, wherein the at least one LPP part and the at least one VPP part are electrically coupled to each other in parallel or in series.

3. The capacitor structure according to claim 1, comprising at least two LPP parts and at least two VPP parts, wherein at least one LPP part and at least one VPP part are electrically coupled to each other in parallel and wherein at least one other LPP part and at least one other VPP part are electrically coupled to each other in series.

4. The capacitor structure according to claim 1,
  wherein both of the second electrodes comprise a plurality of electrode fingers each formed by a plurality of superimposed slabs or bars, the electrode fingers of the two second electrodes forming a comb structure with interdigitated electrode fingers, in which adjacent electrode fingers have alternating polarities, and/or
  wherein said superimposed slabs or bars are electrically connected to each other with one or more electrically conducting vias traversing through each dielectric material layer separating two adjacent metallization layers comprising the superimposed slabs or bars.

5. The capacitor structure according to claim 1, wherein the two first electrodes reside in metallization layers of the capacitor structure that comprise the top and bottom slabs or bars of the second electrodes, which top and bottom slabs or bars define width of the second electrodes in vertical dimension.

6. The capacitor structure according to claim 1, wherein one of the two first electrodes resides in a layer of the capacitor structure that is in vertical dimension above the metallization layer that comprises slabs or bars of the second electrodes defining the upper limit of the width of the second electrodes in vertical dimension, and the other of the two first electrodes resides in a layer of the capacitor structure that comprises slabs or bars of said second electrodes defining the lower limit of the width of the second electrodes in vertical dimension, or one of the two first electrodes resides in a layer of the capacitor structure that is in vertical dimension below the metallization layer that comprises slabs or bars of the second electrodes defining the lower limit of the width of the second electrodes in vertical dimension, and wherein the other of the two first electrodes resides in a layer of the capacitor structure that comprises slabs or bars of the second electrodes defining the upper limit of the width of the second electrodes in vertical dimension.

7. The capacitor structure according to claim 1, wherein one of the two first electrodes resides in a layer of the capacitor structure that is above the metallization layer of the capacitor structure that that comprises slabs or bars of the second electrodes defining the upper limit of the width of the second electrodes in vertical dimension, and the other of the two first electrodes resides in a layer of the capacitor structure that is below the metallization layer of the capacitor structure that comprises slabs or bars of the second electrodes defining the lower limit of the width of the second electrodes in vertical dimension.

8. The capacitor structure according to claim 7, wherein vertical distance between adjacent faces of the two first electrodes is defined by thickness of layers that define width of the two second electrodes in vertical dimension.

9. The electronic device comprising a semiconductor device structure, one or more intermediate layers on top of the semiconductor device structure, and a capacitor structure according to claim 1 arranged either on top of the semiconductor device structure or on top of the intermediate layers.

10. A method for manufacturing a capacitor structure as a layered structure comprising a plurality of alternating dielectric and metallization layers, the metallization layers comprising metal patterns and dielectric material, wherein the method comprises, during the manufacturing process:

generating at least one lateral parallel plate capacitor part (LPP part) comprising two essentially parallel first electrodes by forming two metal patterns in two different metallization layers of the capacitor structure, wherein the two first electrodes are separated by dielectric material of a plurality of said alternating layers, and generating at least one vertical parallel plate capacitor part (VPP part) comprising two second electrodes, wherein each second electrode comprises a plurality of superimposed slabs or bars in a plurality of the metallization layers, wherein the superimposed slabs or bars of each second electrode are electrically coupled to each other by vias, and wherein the at least one VPP part is separate from the at least one LPP part, generating a first electrical contact and a second electrical contact coupled to the at least one VPP part, wherein each of the two second electrodes of the at least one VPP part is coupled to one of the first electrical contact and the second electrical contact, electrically coupling the at least one LPP part with the at least one VPP part via at least one of the first and second electrical contacts to form the capacitor structure, wherein a variation in capacitance value of the capacitor structure due to variation of capacitance value of the at least one LPP part due to a variation of thickness of dielectric material on at least one of said plurality of alternating layers separating the two first electrodes, which variation of thickness causes a difference in distance between the two first electrodes in vertical dimension from a nominal value, is substantially compensated by an opposite variation in capacitance value of the capacitor structure due to variation in capacitance value of the at least one VPP part due to the same variation of thickness of the same at least one of said plurality of alternating layers, due to the same variation of thickness causing a difference in width of the two second electrodes in vertical dimension from a nominal value.

11. A method for manufacturing an electronic device, the method comprising:

manufacturing a semiconductor device structure;

manufacturing one or more intermediate layers on top of the semiconductor device structure; and manufacturing, on top of the semiconductor device structure or on top of the one or more intermediate layers, a capacitor structure, using the method of claim 10.

12. The method for manufacturing an electronic device according to claim 11, wherein the capacitor structure comprises a plurality of alternating dielectric and metallization layers, the metallization layers comprising metal patterns and dielectric material, wherein the capacitor structure comprises:

at least one lateral parallel plate capacitor part (LPP part) comprising two essentially parallel first electrodes, the two first electrodes formed by metal patterns in two of the metallization layers, the two first electrodes being separated from each other by dielectric material of a plurality of the alternating layers, and at least one vertical parallel plate capacitor part (VPP part) comprising two second electrodes each comprising a plurality of superimposed slabs or bars, each superimposed slab or bar patterned in one of said metallization layers, wherein the plurality of superimposed slabs or bars of each second electrode are electrically coupled with each other by vias, and a first electrical contact and a second electrical contact coupled to the at least one VPP part, wherein each of the two second electrodes of the at least one VPP part is coupled to one of the first electrical contact and the second electrical contact, wherein the at least one LPP part is electrically coupled with the at least one VPP part via at least one of the first and second electrical contacts to form the capacitor structure, and wherein a variation in capacitance value of the capacitor structure due to variation of capacitance value of the at least one LPP part due to a variation of thickness of dielectric material in at least one of the plurality of alternating layers separating the two first electrodes, which variation of thickness causes a difference in distance between said two first electrodes in vertical dimension from a nominal value, is substantially compensated by an opposite variation in capacitance value of the capacitor structure due to variation of capacitance value of the at least one VPP part due to the same variation of thickness of the same at least one of said plurality of alternating layers, due to the same variation of thickness causing a difference in width of the two second electrodes in vertical dimension from a nominal value.

\* \* \* \* \*